(12) United States Patent
Sanfilippo et al.

(10) Patent No.: US 11,063,555 B2
(45) Date of Patent: Jul. 13, 2021

(54) METHOD OF FORECASTING FOR SOLAR-BASED POWER SYSTEMS

(71) Applicant: QATAR FOUNDATION FOR EDUCATION, SCIENCE AND COMMUNITY DEVELOPMENT, Washington, DC (US)

(72) Inventors: Antonio Sanfilippo, Doha (QA); Daniel Perez Astudillo, Doha (QA); Dunia Bachour, Doha (QA); Nassma Mohands, Doha (QA); Luis Pomares, Doha (QA)

(73) Assignee: QATAR FOUNDATION FOR EDUCATION, SCIENCE AND COMMUNITY DEVELOPMENT, Doha (QA)

(*) Notice: Subject to any disclaimer, the term of this patent is extended or adjusted under 35 U.S.C. 154(b) by 193 days.

(21) Appl. No.: 15/738,102

(22) PCT Filed: Jun. 23, 2016

(86) PCT No.: PCT/US2016/038977
§ 371 (c)(1),
(2) Date: Dec. 19, 2017

(87) PCT Pub. No.: WO2016/210102
PCT Pub. Date: Dec. 29, 2016

(65) Prior Publication Data
US 2018/0175790 A1    Jun. 21, 2018

Related U.S. Application Data

(60) Provisional application No. 62/183,705, filed on Jun. 23, 2015.

(51) Int. Cl.
*H02S 50/10* (2014.01)
*H02S 50/00* (2014.01)
(Continued)

(52) U.S. Cl.
CPC ............ *H02S 50/10* (2014.12); *G01J 1/4204* (2013.01); *G01R 21/133* (2013.01); *G06N 5/02* (2013.01);
(Continued)

(58) Field of Classification Search
CPC ............ G01J 1/4204; G01J 2001/4276; G01R 21/133; G06N 5/02; H02J 3/383;
(Continued)

(56) References Cited

U.S. PATENT DOCUMENTS 8,295,989 B2    10/2012    Rettger et al.
8,645,304 B2    2/2014    Jiang et al.
(Continued)

FOREIGN PATENT DOCUMENTS

JP    2015-005641    1/2015
WO    2007/047048 A2    4/2007
(Continued)

OTHER PUBLICATIONS

Aguiar et al., "TAG: a time-dependent, autoregressive, Gaussian model for generating synthetic hourly radiation", Solar Energy 49.3 (1992), pp. 167-174 (Abstract only).
(Continued)

*Primary Examiner* — Rexford N Barnie
*Assistant Examiner* — Elim Ortiz
(74) *Attorney, Agent, or Firm* — Nath, Goldberg & Meyer; Richard C. Litman

(57) ABSTRACT

The method of forecasting for solar-based power systems (10) recognizes that no single solar irradiance forecasting model provides the best forecasting prediction for every current weather trend at every time of the year. Instead, the method trains a classifier to select the best solar irradiance forecasting model for prevailing conditions through a machine learning approach. The resulting solar irradiance
(Continued)

forecast predictions are then used to allocate the solar-based power systems (10) resources and modify demand when necessary in order to maintain a substantially constant voltage supply in the system (10).

6 Claims, 15 Drawing Sheets

(51) Int. Cl.
| | | |
|---|---|---|
| G01J 1/42 | (2006.01) | |
| G01R 21/133 | (2006.01) | |
| G06N 5/02 | (2006.01) | |
| H02J 3/38 | (2006.01) | |
| G01W 1/10 | (2006.01) | |

(52) U.S. Cl.
CPC .............. *H02J 3/383* (2013.01); *H02S 50/00* (2013.01); *G01J 2001/4276* (2013.01); *G01W 1/10* (2013.01); *H02J 2203/20* (2020.01)

(58) Field of Classification Search
CPC .... H02J 2003/007; H02S 50/00; H02S 50/10; G01W 1/10
See application file for complete search history.

(56) References Cited

U.S. PATENT DOCUMENTS

| 8,682,585 | B1 | 3/2014 | Hoff | |
|---|---|---|---|---|
| 2005/0039787 | A1* | 2/2005 | Bing | H02J 3/004 |
| | | | | 136/243 |
| 2010/0100328 | A1 | 4/2010 | Moore et al. | |
| 2012/0191351 | A1 | 7/2012 | Kerrigan et al. | |
| 2013/0211722 | A1* | 8/2013 | Hoff | H02J 3/383 |
| | | | | 702/3 |
| 2014/0136178 | A1 | 5/2014 | Meagher et al. | |
| 2014/0278107 | A1 | 9/2014 | Kerrigan et al. | |
| 2014/0278108 | A1 | 9/2014 | Kerrigan | |
| 2014/0289004 | A1 | 9/2014 | Monforte et al. | |
| 2014/0324350 | A1 | 10/2014 | Hamann et al. | |
| 2014/0324352 | A1 | 10/2014 | Hamann et al. | |
| 2015/0019276 | A1 | 1/2015 | Egedal et al. | |
| 2017/0031867 | A1* | 2/2017 | Yuan | G06F 17/18 |

FOREIGN PATENT DOCUMENTS

| WO | 2013/092702 A1 | 6/2013 |
|---|---|---|
| WO | 2014075108 A2 | 5/2014 |
| WO | 2015/152941 A1 | 10/2015 |

OTHER PUBLICATIONS

Bacher et al., "Online short-term solar power forecasting", Solar Energy 83.10 (2009), pp. 1772-1783.

Huang et al., "Forecasting solar radiation on an hourly time scale using a Coupled AutoRegressive and Dynamical System (CARDS) model" Solar Energy 87 (2013), pp. 136-149.

Martin et al., Prediction of global solar irradiance based on time series analysis: Application to solar thermal power plants energy production planning, Solar Energy 84.10 (2010), pp. 1772-1781.

Hocaoglu et al., "Hourly solar radiation forecasting using optimal coefficient 2-D linear filters and feed-forward neural networks", Solar Energy 82.8 (2008) pp. 714-726.

Wang et al., "Short-term solar irradiance forecasting model based on artificial neural network using statistical feature parameters", Energires 5.5 (2012), pp. 1355-1370.

* cited by examiner

METHOD OF FORECASTING FOR SOLAR-BASED POWER SYSTEMS

TECHNICAL FIELD

The present invention relates to a method of forecasting for solar-based power systems, and particularly a method for forecasting solar irradiance applied to photovoltaic systems and the like.

BACKGROUND ART

The ability to forecast solar irradiance in near-real time is useful in managing power grid integration of renewable energy harnessed through such technologies as solar heating, photovoltaics (PV), solar thermal energy, solar architecture, and artificial photosynthesis. Solar irradiance is subject to sudden variations due to meteorological change, such as clouds, haze, and dust storms. When significant amounts of solar energy are introduced into the power grid, sudden changes in solar irradiance can trigger grid instability. For example, a cloud formation passing over a PV array can block up to 80% of the total irradiance reaching the PV array. Such a blockage would cause a rapid and steep fall in the power harnessed by the PV array, leading to unacceptable voltage deviations. Solar forecasting can help solve this problem by providing insights about forthcoming changes in solar irradiance that can be used to take preventive or reactive actions. Such actions may include the use of other energy sources to make up for the shortage of solar energy, a reduction of the rate of solar energy conversion to accommodate solar energy surplus, or storage of solar energy surplus.

Solar forecasting is typically carried out using physical or statistical approaches. The physical approach relies on Numerical Weather Prediction (NWP) models, which use mathematical models of the atmosphere and oceans to predict the evolution of the atmosphere from initial conditions. The statistical approach uses data mining techniques to train computational models on historical solar irradiation data, sometimes in conjunction with other meteorological data. NPW models provide a useful method to forecast solar irradiance beyond six hours and up to several days ahead, but are not appropriate for higher-resolution time forecasts (e.g., minutes) due to their coarse resolution. More specifically, the spatial and temporal granularity of even the highest resolution NWP models, such as the North American Mesoscale Forecast System (NAM), are insufficient to resolve most clouds and any patterns with characteristic timescales less than one hour.

Depending on the kind of instrument used in combination with statistical models, one can differentiate three kind of predictions, depending on the horizon of prediction: (1) predictions based on radiometric measurements can be used in combination with statistical models to obtain predictions with a temporal step from 1 second to 15 minutes and a horizon of less than 1 hour; (2) predictions based on sky cameras can be used to obtain predictions with a temporal step from 5 minutes to 15 minutes and a temporal horizon of less than 2-4 hours, depending on the location; and (3) satellite images can provide predictions of solar radiation with a temporal step from 5 minutes to 30 minutes, depending on the geostationary satellite used, and a temporal horizon of less than 6 hour. The predictions from these three instruments and models can be superposed, and sometimes one can use a combination of their predictions. Both NWP, satellite and sky camera imaging techniques lack the spatial and temporal resolution to provide information regarding high temporal frequency fluctuations of solar irradiance. An alternative is provided through ground measurements of local meteorological conditions for temporal steps beyond 1 to 15 minutes.

With higher-resolution timescales, machine learning and statistical techniques have been shown to provide an effective methodology for solar forecasting. Various statistical and machine learning techniques have been used to forecast solar irradiance, including Autoregressive Moving Average (ARMA), Autoregressive Integrated Moving Average (ARIMA), Coupled Autoregressive and Dynamical System (CARDS), Artificial Neural Network (ANN), and Support Vector Regression (SVR). These algorithms have also been successfully improved through combination with data filtering techniques, such as wavelet transforms. For evaluation purposes, the Persistence model, according to which no difference is assumed between current and future irradiance values, is usually used as a baseline.

One of the main problems with solar now-casting is that no single forecasting model can consistently provide superior forecasts in all prediction instances. Evaluation of forecasting results against observed data show that different forecasting approaches, including persistence, can rival each other across non-aggregated (e.g., minute by minute) forecast units. Thus, a method of forecasting for solar-based power systems solving the aforementioned problems is desired.

DISCLOSURE OF INVENTION

The method of forecasting for solar-based power systems recognizes that no single solar irradiance forecasting model provides the best forecasting prediction for every current weather trend at every time of the year. Instead, the present method trains a classifier to select the best solar irradiance forecasting model for prevailing conditions through a machine learning approach. The resulting solar irradiance forecast predictions are then used to allocate the solar-based power systems resources and modify demand when necessary in order to maintain a substantially constant voltage supply in the system.

The method of forecasting for solar-based power systems includes the following steps: (a) measuring solar irradiance parameters with sensors for a defined geographical region over predetermined time intervals to form a data set; (b) selecting a window size defining a number of past measurements and future forecast predictions to be made from the number of past measurements; (c) partitioning the data set into successive and adjacent time series training data sequences of the selected window size; (d) applying each of a selected plurality of forecasting methods to the time series training data sequences to obtain future forecast predictions from the forecasting methods applied; (e) comparing the future forecast predictions of each of the forecasting methods to measured data to obtain a corresponding error rate associated with each of the methods, given the time series training data sequences; (f) assigning the forecasting method with the lowest error rate as the forecasting class for the time series training data sequences; (g) repeating steps (a) through (f) to train a classifier to determine an optimal forecasting class for different time series training data sequences; (h) using the sensors to measure current solar irradiance parameters; (i) using the classifier to determine the optimal forecasting class for the current solar irradiance parameters; (j) making future forecast predictions from the current solar irradiance parameters using the optimal forecasting class; (k) predicting solar-based power system demands and generating capacities based upon the future forecast predictions made in step (j); and (l) making adjustments in the solar-based power system demands and stored energy in order to maintain a substantially constant voltage supply for the geographic region.

In the above method, several modeling techniques may be used as the forecasting methods, such as the aforementioned statistical and machine learning techniques. Preferably, the Persistence technique and the Support Vector Regression (SVR) technique are each included in the selected forecasting methods, as well as various autoregressive (AR) models for the prediction of solar radiation in the short term (i.e., "now-casting") using ground measurements, such as radiometric measurements. This allows for temporal steps of predictions of 1, 5 and 10 minutes. The temporal horizon in all three cases is 15 temporal steps ahead.

These and other features of the present invention will become readily apparent upon further review of the following specification and drawings.

BRIEF DESCRIPTION OF DRAWINGS

Similar reference characters denote corresponding features consistently throughout the attached drawings.

BEST MODES FOR CARRYING OUT THE INVENTION

Figure 1:
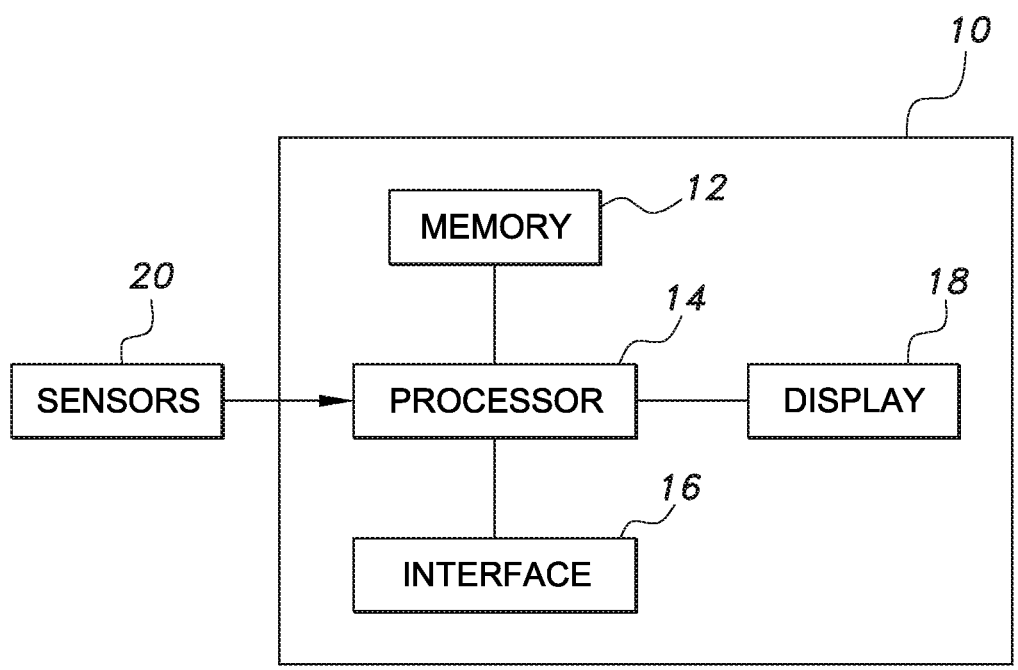
FIG. 1 is a block diagram illustrating system components for implementing a method of forecasting for solar-based power systems according to the present invention.

The method of forecasting for solar-based power systems recognizes that no single solar irradiance forecasting model provides the best forecasting prediction for every current weather trend at every time of the year. Instead, the present method uses model evaluation data to train a classifier that enables the selection of the best solar irradiance forecasting model for prevailing conditions through a machine learning approach. The resulting solar irradiance forecast predictions are then used to allocate the solar-based power systems resources and modify demand when necessary in order to maintain a substantially constant voltage supply in the system.

Generally, the method of forecasting for solar-based power systems includes the following steps: (a) measuring solar irradiance parameters with sensors for a defined geographical region over predetermined time intervals to form a data set; (b) selecting a window size defining a number of past measurements and future forecast predictions to be made from the number of past measurements; (c) partitioning the data set into successive and adjacent time series training data sequences of the selected window size; (d) applying each of a selected plurality of forecasting methods to the time series training data sequences to obtain future forecast predictions from the forecasting methods applied; (e) comparing the future forecast predictions of each of the forecasting methods to measured data to obtain a corresponding error rate associated with each of the methods, given the time series training data sequences; (f) assigning the forecasting method with the lowest error rate as the forecasting class for the time series training data sequences; (g) repeating steps (a) through (f) for the selected plurality of forecasting methods and use the resulting forecasting evaluation data to train a classifier to determine an optimal forecasting class for different time series training data sequences; (h) using the sensors to measure current solar irradiance parameters; (i) using the classifier to determine the optimal forecasting class for the current solar irradiance parameters; (j) making future forecast predictions from the current solar irradiance parameters using the optimal forecasting class; (k) predicting solar-based power system demands and generating capacities based upon the future forecast predictions made in step (j); and (l) making adjustments in the solar-based power system demands and stored energy in order to maintain a substantially constant voltage supply for the geographic region.

In step (a) above, ground-measured solar radiation data is used to create data files, such as the exemplary data file shown below in Table 1. In Table 1, direct normal irradiance (DNI), global horizontal irradiance (GHI) and diffuse horizontal irradiance (DHI) are each provided as one-minute averages of the measured solar radiation components (measured in $W/m^2$). Each component in Table 1 was measured by a different sensor mounted on a high-precision solar radiation monitoring station.

TABLE 1

Measured Solar Radiation Parameters

| YYYY-MM-DD-HH-MM | DNI | GHI | DHI | Kt | Kt_p |
|---|---|---|---|---|---|
| 2014-03-05-06-47 | 305.34 | 167.55 | 102.75 | 0.65 | 0.92 |
| 2014-03-05-06-48 | 270.89 | 156.47 | 97.45 | 0.60 | 0.84 |
| 2014-03-05-06-49 | 221.88 | 141.53 | 91.46 | 0.53 | 0.74 |
| 2014-03-05-06-50 | 179.62 | 128.26 | 86.32 | 0.47 | 0.65 |
| 2014-03-05-06-51 | 84.08 | 105.34 | 82.82 | 0.38 | 0.52 |
| 2014-03-05-06-52 | 108.30 | 113.37 | 85.17 | 0.40 | 0.55 |
| ... | ... | ... | ... | ... | ... |
| 2014-03-05-09-46 | 624.76 | 688.97 | 225.32 | 0.681 | 0.703 |

In the above, Kt and Kt_p are clearness indices, calculated from the ground-measured GHI. Kt is the ratio of GHI to the calculated global horizontal radiation at the top of the atmosphere. Kt removes the seasonal dependence of GHI throughout the year. Kt_p is a modified form of Kt, which adds a correction factor for the changing atmospheric air masses traversed by the solar radiation at any moment. Kt and Kt_p are given by:

$$Kt = \frac{GHI}{GHItoa} \quad (1)$$

$$Kt_p = \frac{Kt}{1.031e^{-1.4/(0.9+9.4/am)} + 0.1} \quad (2)$$

$$am = \frac{1}{\cos(SZA) + 0.50573(96.07995 - SZA)^{-1.6364}}, \quad (3)$$

where $GHI_{toa}$ is the extraterrestrial solar radiation on a horizontal surface at the top of the atmosphere, am is the air mass, and SZA is the solar zenith angle in degrees. In order to ensure good accuracy in the modeling results, only measured data that pass some quality control tests should be included. For the data given above, the recommended Baseline Surface Radiation Network quality tests were applied to all entries. Several or just a single measure of solar irradiance can be used. In the present embodiment, all examples will be given with reference to the single measure Kt_p.

Data filtering may be applied to the data set generated in step (a). Any suitable technique, such as normalization, discretization, or wavelet analysis, used alone or in combination, may be used to remove noise from the data. With normalization, all numeric values in the given data set are mapped into a standard numerical interval, typically 0-1. Discretization maps continuous numeric values into discrete counterparts (e.g., high, medium, low). The wavelet transform enables the decomposition of a time series into a time dependent sum of frequency components.

In order to select the window size defining a number of past measurements and future forecast predictions to be made from the number of past measurements (step (b)), the number of steps ahead to be forecasted are first selected. Then, several data points are selected, at the beginning, middle and end of the data collection. For each data point, an initial training data set T is created with a window size, i, given by i=n+m, where m is the number of steps ahead to be forecasted, and n is some function over m, e.g., 3 m. One or several forecasting algorithms are then applied to T and the results are evaluated using an evaluation measure such as the Coefficient of Variation of the Root Mean Square Error (cvRMSE) to compare predicted (pred) against observed (obs) values. Here, $$cvRMSE = \frac{\sqrt{\frac{\sum_{t=1}^{n}(x_{pred_t} - x_{obs_t})^2}{n}}}{\operatorname{mean}(obs_{ti-n})}.$$

The window size, i, is successively increased and decreased until the best evaluation results (e.g., the lowest cvRMSE) are found, to determine the best training window size j.

In step (c), the training data is partitioned into successive and adjacent time series training data sequences of the selected window size. For example, if the time scale is minutes, an ideal training window size may be 180 minutes, and the time series data for Kt_p would be as indicated in Table 2 below.

TABLE 2

Exemplary Partitioning of Training Data

| Period for Kt_p Prediction | Kt_p at minute 1 | ... | Kt_p at minute 180 |
|---|---|---|---|
| 2014-12-01-06-57→2014-12-01-09-56 | 0.080137 | ... | 0.067823 |
| 2014-12-01-06-57→2014-12-01-09-56 | 0.080137 | ... | 0.067823 |
| 2014-12-01-06-57→2014-12-01-09-56 | 0.080137 | ... | 0.067823 |
| 2014-12-01-06-57→2014-12-01-09-56 | 0.080137 | ... | 0.067823 |
| 2014-12-01-06-57→2014-12-01-09-56 | 0.080137 | ... | 0.067823 |
| 2014-12-01-06-57→2014-12-01-09-56 | 0.080137 | ... | 0.067823 |
| ... | ... | ... | ... |

In step (d), each of a plurality of forecasting methods is applied to the time series training data sequences to obtain future forecast predictions from the forecasting method applied. The different forecasting models are developed to predict n-steps ahead for the solar irradiance variable of interest, using as training data the time series data developed above. In the present embodiment, two forecasting models are exemplified: Persistence and Support Vector Regression (SVR). The persistence model assumes that no change occurs from the present state throughout the forecasting period. In SVR, within a machine learning approach to forecasting, each training sample is a pair $\{\vec{x}, y\}$, where $\vec{x} \in \mathbb{R}^n$ is a vector for the time-series class to be learned, and $y \in \mathbb{R}$ y is the associated value. The aim of the machine learning algorithm is to find a function such that each $\vec{x}_I$ in the training dataset approximates its value $y_i$ as closely as possible. The resulting function is then used to predict values n-steps ahead of the time series data used for training. When the input data are amenable to linear regression, the SVR prediction function is given by $y_i = \vec{w} \cdot \vec{x}_I + b$, where $i=1, \ldots, n$, $\vec{w}$ is the weight vector (i.e., a linear combination of training patterns that supports the regression function), $\vec{x}_I$ is the input vector (i.e., the training sample), $y_i$ is the value for the input vector, and b is the bias (i.e., an average over marginal vectors, which are weight vectors that lie within the margins set by the loss function).

The objective of regression is to learn the weight vector $\vec{w}$ that has the smallest possible length so as to avoid over-fitting. To ease the regression task, a given margin of deviation $\varepsilon$ is allowed with no penalty, and a given margin $\xi$ is specified where deviation is allowed with increasing penalty. The length of the weight vector $\vec{w}$ is obtained by minimizing the loss function, $\frac{1}{2}\|\vec{w}\|^2 + C \sum_{t=1}^{n}(\xi_i + \xi^*_i)^1$, subject to the constraints $y_i - (\vec{w} \cdot \vec{x}_I + b) \leq \varepsilon + \xi_i$, or $y_i - (\vec{w} \cdot \vec{x}_I + b) \geq \varepsilon - \xi^*_i$, for $\xi_i, \xi^*_i \geq 0$. The solution is given by $y_i = \sum_{i=1}^{n}(a_i - a^*_i)(\vec{w} \cdot \vec{x}_I) + b$, where $a_i$ and $a^*_i$ are Lagrange multipliers. The training vectors giving nonzero Lagrange multipliers are called support vectors and are used to construct the regression function. If the input data are not amenable to linear regression, then the vector data are mapped into a higher dimensional features space using a kernel function $\Phi$. One example is the polynomial kernel, according to which $\Phi(\vec{w}) \cdot \Phi(\vec{x}_I) = (1 + \vec{w} \cdot \vec{x}_I)^3$.

The forecasting models are next evaluated, using an evaluation measure such as cvRMSE. Forecasting evaluation results relative to each prediction step are stored for each training data sequence (e.g., the 180 minutes used above), as shown in Table 3.

TABLE 3

| | Forecasting Evaluation Results | | | | |
|---|---|---|---|---|---|
| Period for Kt_p Prediction | cvRMSE for SVR model at 1 step ahead | cvRMSE for Persistence model at 1 step ahead | ... | cvRMSE for SVR model at n steps ahead | cvRMSE for Persistence model at n steps ahead |
| 2014-12-01-06-57→2014-12-01-09-56 | 1.941569 | 3.522824 | ... | ... | ... |
| 2014-12-01-06-57→2014-12-01-09-56 | 4.299455 | 8.545602 | ... | ... | ... |
| 2014-12-01-06-57→2014-12-01-09-56 | 7.165063 | 14.192361 | ... | ... | ... |
| 2014-12-01-06-57→2014-12-01-09-56 | 4.637791 | 14.184008 | ... | ... | ... |
| 2014-12-01-06-57→2014-12-01-09-56 | 5.841919 | 5.199473 | ... | ... | ... |
| 2014-12-01-06-57→2014-12-01-09-56 | 25.469365 | 15.143792 | ... | ... | ... |
| ... | ... | ... | ... | ... | ... |

The forecasting models are then saved as software components that take as input a time series data sequence to output predictions for m steps ahead. Next, classification models are developed to selected the best forecasting method. A time series data set is created that includes the evaluated forecasting models and their time series training data, as shown below in Table 4.

TABLE 4

Time Series Data Created to Train Classification Models

| Period for Kt_p Prediction | cvRMSE for SVR model (average over all steps ahead) | cvRMSE for Persistence model (average over all steps ahead) | Kt_p at minute 1 | ... | Kt_p at minute 180 |
|---|---|---|---|---|---|
| 2014-12-01-06-57→ 2014-12-01-09-56 | 1.9416 | 3.5228 | 0.0801 | ... | 0.2810 |
| 2014-12-01-06-57→ 2014-12-01-09-56 | 4.2995 | 8.5456 | 0.0801 | ... | 0.2810 |
| 2014-12-01-06-57→ 2014-12-01-09-56 | 7.1651 | 14.1924 | 0.0801 | ... | 0.2810 |
| 2014-12-01-06-57→ 2014-12-01-09-56 | 4.6378 | 14.1840 | 0.0801 | ... | 0.2810 |
| 2014-12-01-06-57→ 2014-12-01-09-56 | 5.8419 | 5.1995 | 0.0801 | ... | 0.2810 |
| 2014-12-01-06-57→ 2014-12-01-09-56 | 25.4694 | 15.1438 | 0.0801 | ... | 0.2810 |
| ... | ... | ... | ... | ... | ... |

In step (f), the forecasting method with the lowest error rate is assigned as the forecasting class for the time series training data sequences. The best performing class is established as the model with the best evaluation results; e.g., a lower cvRMSE, as shown in Table 5.

TABLE 5

Model Class Assignment to Training Records

| Period for Kt_p Prediction | cvRMSE for SVR model (average over all steps ahead) | cvRMSE for Persistence model (average over all steps ahead) | Kt_p at minute 1 | ... | Kt_p at minute 180 | Model Class |
|---|---|---|---|---|---|---|
| 2014-12-01-06-57→ 2014-12-01-09-56 | 1.9416 | 3.5228 | 0.0801 | ... | 0.2810 | SVR |
| 2014-12-01-06-57→ 2014-12-01-09-56 | 4.2995 | 8.5456 | 0.0801 | ... | 0.2810 | SVR |
| 2014-12-01-06-57→ 2014-12-01-09-56 | 7.1651 | 14.1924 | 0.0801 | ... | 0.2810 | SVR |
| 2014-12-01-06-57→ 2014-12-01-09-56 | 4.6378 | 14.1840 | 0.0801 | ... | 0.2810 | SVR |
| 2014-12-01-06-57→ 2014-12-01-09-56 | 5.8419 | 5.1995 | 0.0801 | ... | 0.2810 | PER |
| 2014-12-01-06-57→ 2014-12-01-09-56 | 25.4694 | 15.1438 | 0.0801 | ... | 0.2810 | PER |
| ... | ... | ... | ... | ... | ... | |

Additional data filtering processes may be applied to the above data set. Data can be filtered using any suitable filtering techniques, such as discretization, normalization or wavelet transforms, or a combination of these. The data is then used to train a classification model capable of recognizing the highest ranking model given an input time series training data sequence. A number of machine learning algorithms can be used to train a classifier from data, such as, for example, the decision-tree classification algorithm. In decision-tree classification, the model identifies members of a class as the result of a sequence of decisions. A decision tree typically consists of two types of nodes: test nodes and prediction nodes. The test node describes the condition that must be met in order to make a decision. Several test nodes can occur in a sequence to indicate the number of decisions that must be taken and the order in which these decisions follow one another to reach a prediction outcome.

A decision tree classifier is "learned" from a training dataset by a model which establishes the sequential order of test nodes according to how informative the nodes' attributes are. The model determines the information content of an attribute by its information gain with respect to the classification tasks. The information gain of an attribute with respect to a class is the reduction in entropy (i.e., the uncertainty) of the value for the class the value of the attribute is known. The test nodes with more informative attributes occur earlier in the decision tree. The model creates test nodes using the available attributes until all data in the training dataset have been accounted for. Typically, not all attributes are used because decision tree learners use pruning strategies to reduce the number of nodes. The number of attributes depends on the specific implementation. The "alternating decision tree algorithm" uses a machine learning meta-algorithm, called "boosting", to minimize the number of nodes without losing accuracy. It should be understood that any suitable classification algorithm may be used, such as, for example, Bayesian nets, Support Vector Machines, boosting, Naïve Bayes, bagging, random forest and Model Trees. The classification model is saved as a software component capable of recognizing the highest ranking model given an input time series training data sequence.

It should be understood that the calculations may be performed by any suitable computer system, such as that diagrammatically shown in FIG. 1. Data is entered into system 10 via any suitable type of user interface 16, and may be stored in memory 12, which may be any suitable type of computer readable and programmable memory and is preferably a non-transitory, computer readable storage medium. Calculations are performed by processor 14, which may be any suitable type of computer processor and may be displayed to the user on display 18, which may be any suitable type of computer display. Sensor data is collected from solar irradiance sensors 20, such as, for example, satellite and sky cameras, radiometric sensors, pyrheliometers, pyranometers and the like.

Processor 14 may be associated with, or incorporated into, any suitable type of computing device, for example, a personal computer or a programmable logic controller. The display 18, the processor 14, the memory 12 and any associated computer readable recording media are in communication with one another by any suitable type of data bus, as is well known in the art.

Examples of computer-readable recording media include non-transitory storage media, a magnetic recording apparatus, an optical disk, a magneto-optical disk, and/or a semiconductor memory (for example, RAM, ROM, etc.). Examples of magnetic recording apparatus that may be used in addition to memory 112, or in place of memory 12, include a hard disk device (HDD), a flexible disk (FD), and a magnetic tape (MT). Examples of the optical disk include a DVD (Digital Versatile Disc), a DVD-RAM, a CD-ROM (Compact Disc-Read Only Memory), and a CD-R (Recordable)/RW. It should be understood that non-transitory computer-readable storage media include all computer-readable media, with the sole exception being a transitory, propagating signal.

In the above method, the Persistence technique and the Support Vector Regression (SVR) technique may be used as the forecasting methods. As an alternative, the Persistence model may be replaced by autoregressive (AR) models, particularly for the prediction of solar radiation in the short term (i.e., "now-casting") using ground measurements, such as radiometric measurements. This allows for temporal steps of predictions of 1, 5 and 10 minutes. The temporal horizon in all three cases is 15 temporal steps ahead. In the below, due to non-stationary behavior, global solar irradiance has been transformed to a normalized clearness index $K^*_T$. The clearness index is defined as the ratio between ground measured global solar irradiance and extraterrestrial solar irradiance, including a correction for air mass.

Autoregressive models generate lineal predictions from the input and are also known as Infinite Impulse Response Filters (IIRFs). The notation AR(p) refers to the autoregressive model of order p. The AR(p) is expressed by the following equation:

$$\hat{x}_t = c + \sum_{i=1}^{P} a_i x_{t-i} + \varepsilon_t,$$

where $a_i$ are the parameters of the model, c is a constant which represents the mean value of the time series, and $\varepsilon_t$ is a white noise signal. As will be discussed in greater detail below, twenty different autoregressive models AR(p) have been tested, with order p=1, ..., 20 for 1, 5 and 10 minutes average time series. Exemplary data are from the Qatar Environment and Energy Research Institute (QEERI), which has been operating a high precision solar radiation monitoring station since the end of November 2012 in Education City, Doha (25.33° N, 51.43° E). The station is equipped with a solar tracker with a sun sensor kit, for improved tracking accuracy, and a shading ball assembly for diffuse measurements. Mounted on the sun tracker are one first class pyrheliometer for measuring Direct Normal Irradiance (DNI), and two secondary standard pyranometers (one of them shaded) for Global Horizontal Irradiance (GHI) and Diffuse Horizontal Irradiance (DHI) measurements. Both pyranometers are fitted with ventilation units. Data from the monitoring station are sampled every second and recorded as minute averages in W/m².

Figure 2A:
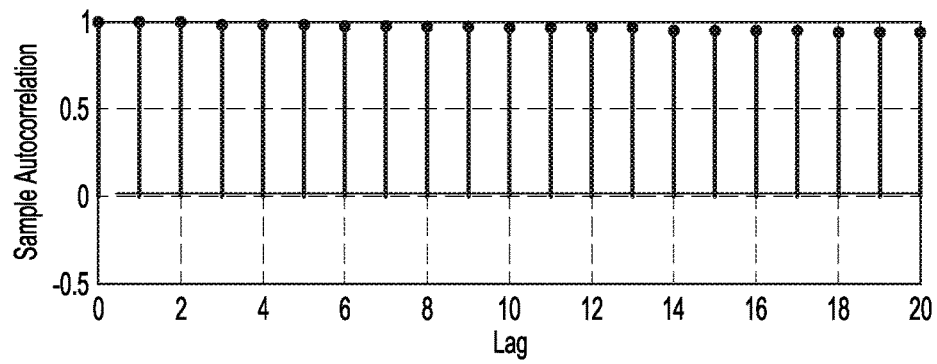
FIG. 2A is a graph illustrating autocorrelation of a one-minute time series used in an embodiment of the method of forecasting for solar-based power systems.
Figure 2B:
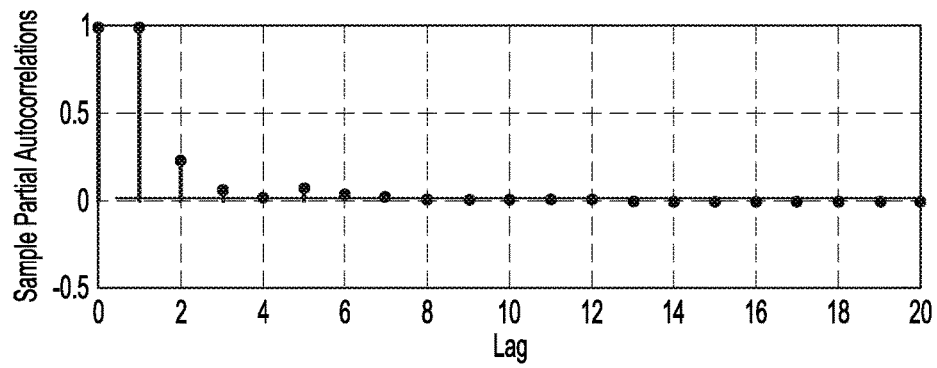
FIG. 2B is a graph illustrating partial autocorrelation of the one-minute time series used in the embodiment of the method used in FIG. 2A.
Figure 3A:
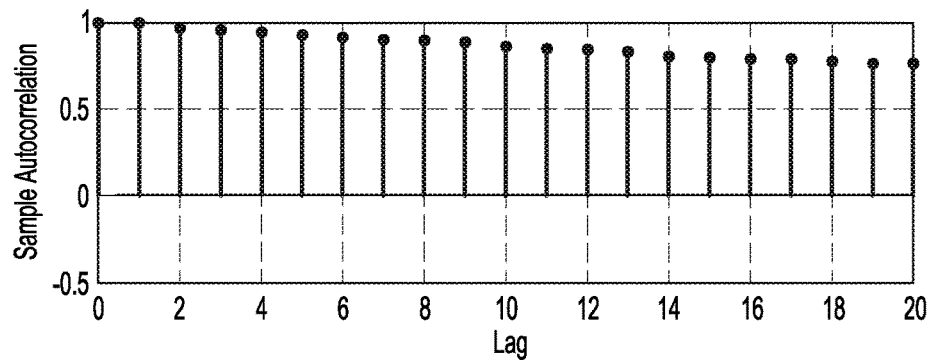
FIG. 3A is a graph illustrating autocorrelation of a five-minute time series used in the embodiment of the method used in FIG. 2A.
Figure 3B:
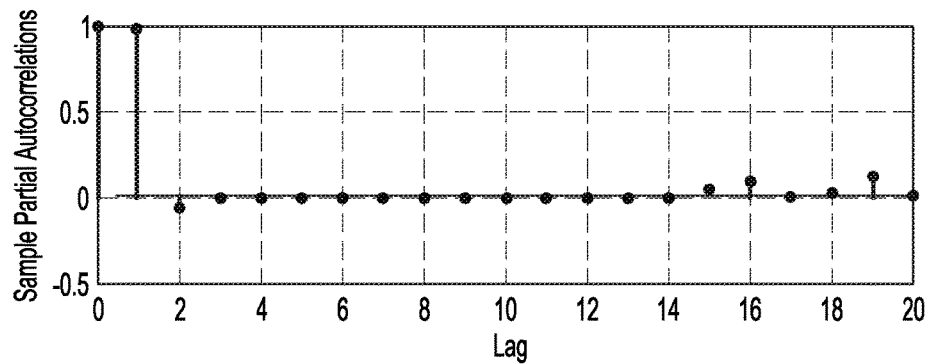
FIG. 3B is a graph illustrating partial autocorrelation of the five-minute time series used in the embodiment of the method used in FIG. 2A.
Figure 4A:
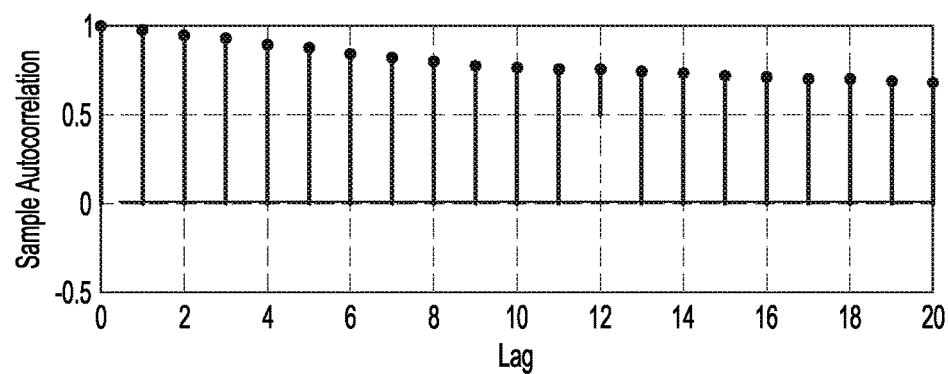
FIG. 4A is a graph illustrating autocorrelation of a ten-minute time series used in the embodiment of the method used in FIG. 2A.
Figure 4B:
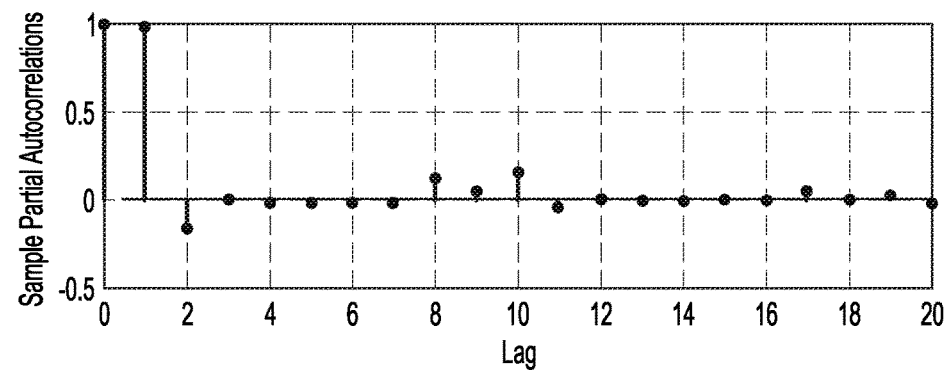
FIG. 4B is a graph illustrating partial autocorrelation of the ten-minute time series used in the embodiment of the method used in FIG. 2A.

FIGS. 2A and 2B show autocorrelation and partial autocorrelation of a one-minute time series used in the alternative embodiment of the method of forecasting for solar-based power systems, respectively. Similarly, FIGS. 3A and 3B show autocorrelation and partial autocorrelation of a five-minute time series, respectively, and FIGS. 4A and 4B show autocorrelation and partial autocorrelation of a ten-minute time series. The metrics to measure the errors rates of the models are the mean bias deviation (MBD), the relative root mean squared deviation (RMSD) and its relative values rMBD and rRMSD normalized with the mean value of the observed variable to predict for the period under validation.

The present models are compared with a baseline model, with the intention of measuring the improvement achieved. The basic model chosen is the persistence model (PER) because it is the most extended model to contrast new proposed models. As described above, persistence is based on the assumption that the value for the next temporal step is the same as the present value: $\hat{x}_{t+k} = x_t$, where $\hat{x}_{t+k}$ is the prediction for the next k steps, and $x_t$ is the observation at the temporal instant t.

Figure 5:
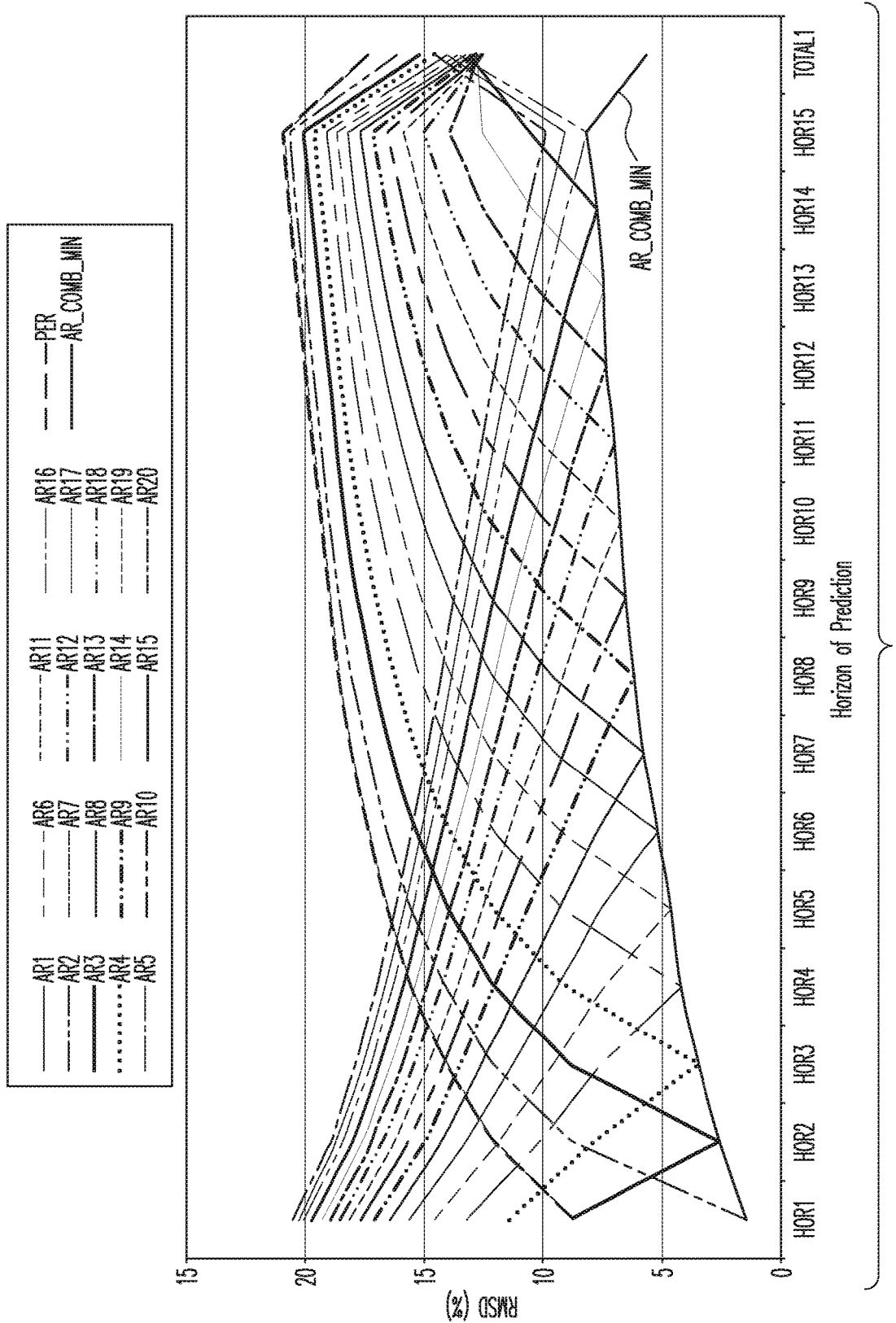
FIG. 5 is a graph comparing relative root mean squared deviation (RMSD) of the autoregressive (AR) models of order 1-20 against the persistence (PER) model, and a combination of the autoregressive models in an embodiment of the method of forecasting for solar-based power systems, specifically for each horizon of prediction applied to one-minute average time series data, with the data set being recorded in January of 2014.
Figure 6:
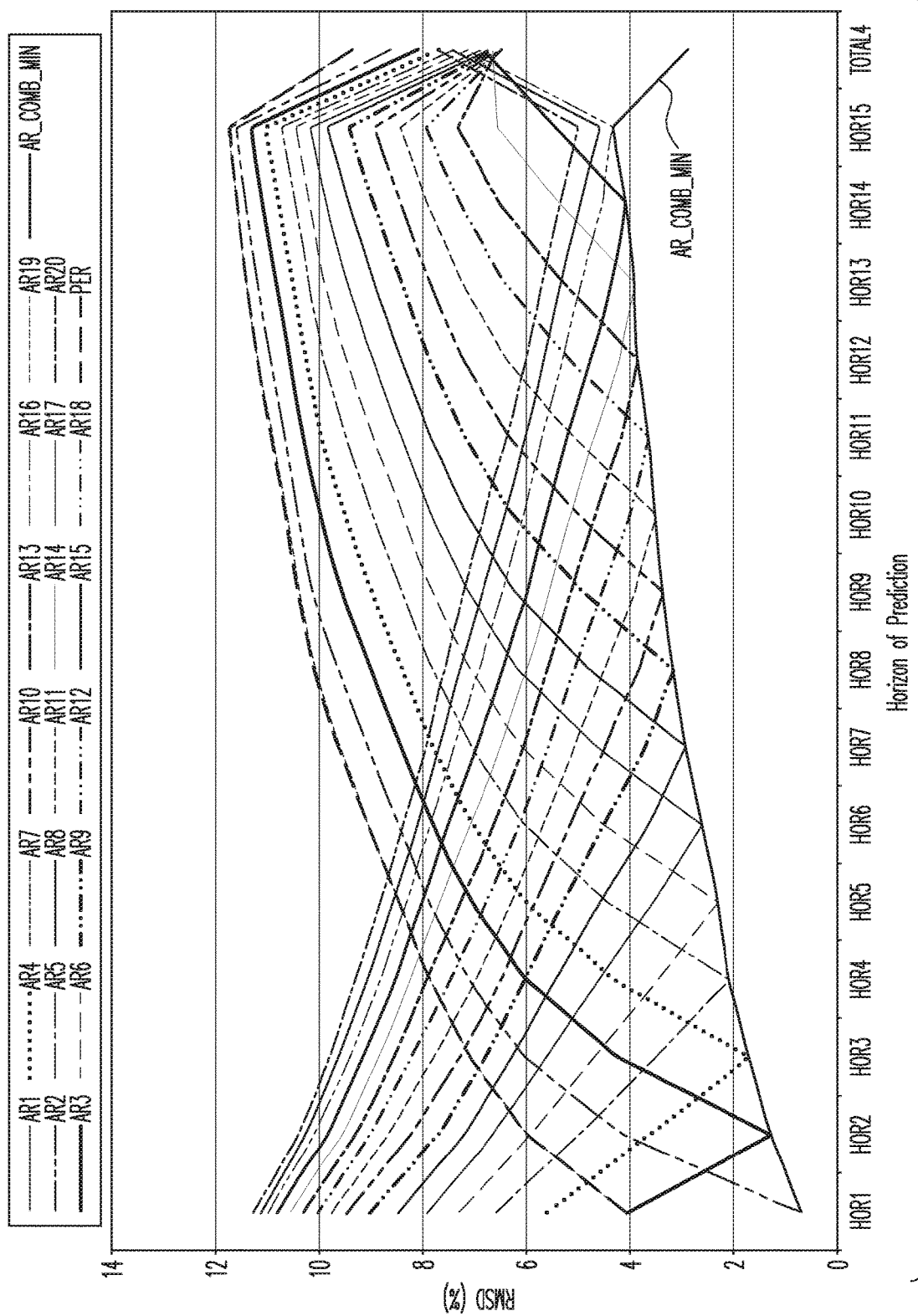
FIG. 6 is a graph comparing relative root mean squared deviation (RMSD) of the autoregressive (AR) models of order 1-20 against the persistence (PER) model, and a combination of the autoregressive models in an embodiment of the method of forecasting for solar-based power systems, specifically for each horizon of prediction applied to one-minute average time series data, with a data set recorded in April of 2014.
Figure 7:
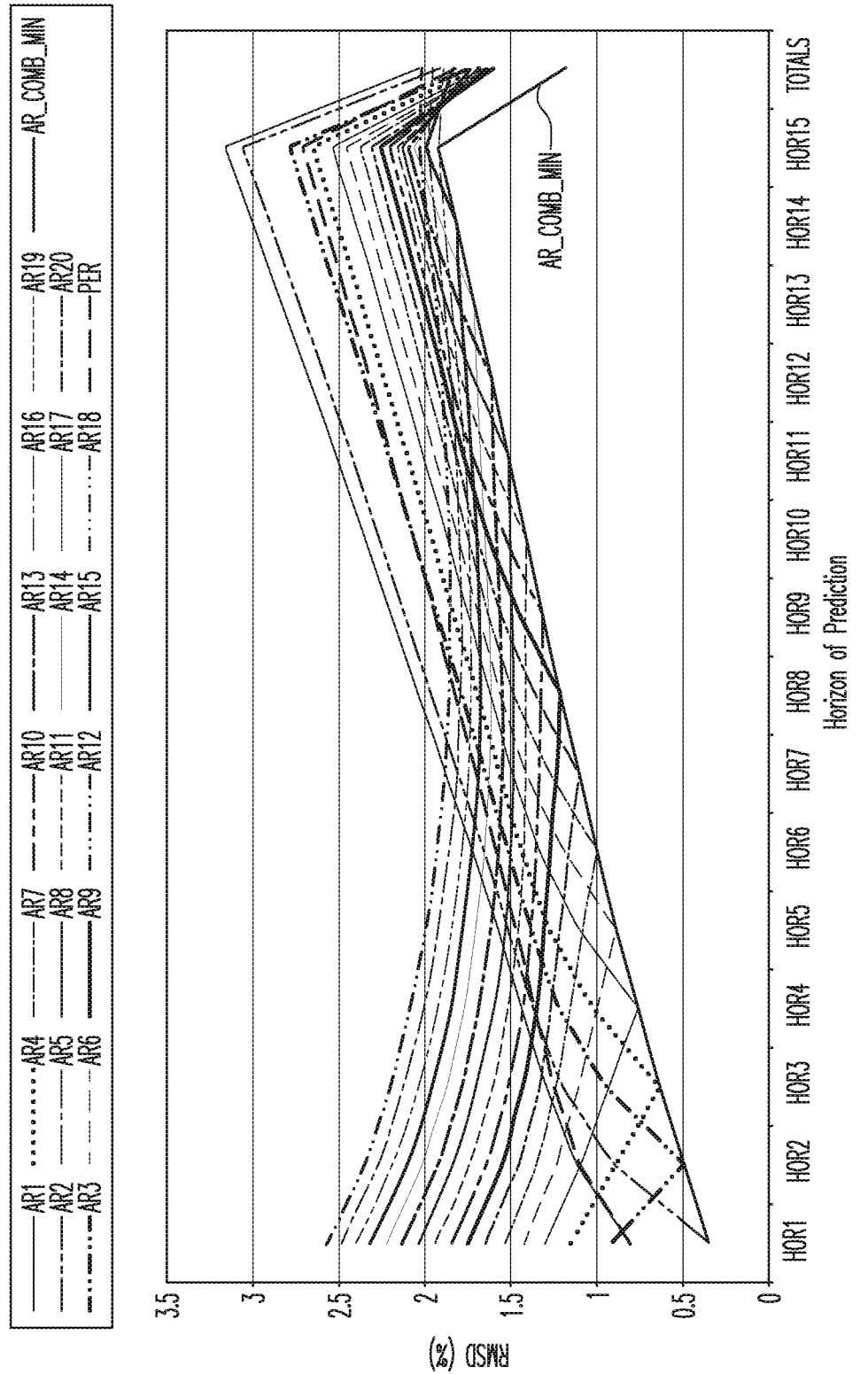
FIG. 7 is a graph comparing relative root mean squared deviation (RMSD) of the autoregressive (AR) models of order 1-20 against the persistence (PER) model, and a combination of the autoregressive models in an embodiment of the method of forecasting for solar-based power systems, specifically for each horizon of prediction applied to one-minute average time series data, with a data set recorded in June of 2014.

FIG. 5 is a graph comparing relative root mean squared deviation (RMSD) of the autocorrelation (AR) model against the persistence (PER) model, and a combination autocorrelation model in the alternative embodiment of the method of forecasting for solar-based power systems, specifically for each horizon of prediction applied to one-minute average time series data (taken from January of 2014). The new "AR combined" model (AR_COMB_MIN) is detailed below. FIGS. 6 and 7 show similar comparisons for data sets recorded in April of 2014 and June of 2014, respectively.

Analysis of this data shows that there is a dependence on the horizon of prediction and the complexity of the AR models which provide the minimum error. For each horizon n, the best results in terms of minimum rRMSD are obtained with an AR model of order (n+1)[AR (n+1)]. This is the "AR combined" model (AR_COMB_MIN) noted above. The same behavior is also observed in the 5 and 10 minutes time series. Table 6 shows MBD, RMSD, rMBD and rRMSD results for the AR, PER and AR-combined models with the one-minute time series from 2014.

TABLE 6

MBD, RMSD, rMBD and rRMSD Results for AR, PER and AR-combined Models with One-minute Time Series

| Model | MBD | RMSD | rMBD(%) | rRMSD(%) |
|---|---|---|---|---|
| AR(1) | −0.01 | 0.06 | −0.84 | 9.44 |
| AR(2) | −0.01 | 0.06 | −0.81 | 8.76 |

TABLE 6-continued

MBD, RMSD, rMBD and rRMSD Results for AR, PER and
AR-combined Models with One-minute Time Series

| Model | MBD | RMSD | rMBD(%) | rRMSD(%) |
|---|---|---|---|---|
| AR(3) | 0.00 | 0.06 | −0.59 | 8.26 |
| AR(4) | 0.00 | 0.05 | −0.50 | 7.91 |
| AR(5) | 0.00 | 0.05 | −0.43 | 7.63 |
| AR(6) | 0.00 | 0.05 | −0.39 | 7.40 |
| AR(7) | 0.00 | 0.05 | −0.35 | 7.24 |
| AR(8) | 0.00 | 0.05 | −0.31 | 7.12 |
| AR(9) | 0.00 | 0.05 | −0.28 | 7.01 |
| AR(10) | 0.00 | 0.05 | −0.26 | 6.94 |
| AR(11) | 0.00 | 0.05 | −0.24 | 6.90 |
| AR(12) | 0.00 | 0.05 | −0.23 | 6.91 |
| AR(13) | 0.00 | 0.05 | −0.21 | 6.99 |
| AR(14) | 0.00 | 0.05 | −0.21 | 7.07 |
| AR(15) | 0.00 | 0.05 | −0.20 | 7.24 |
| AR(16) | 0.00 | 0.05 | −0.18 | 7.51 |
| AR(17) | 0.00 | 0.05 | −0.18 | 7.78 |
| AR(18) | 0.00 | 0.05 | −0.17 | 8.04 |
| AR(19) | 0.00 | 0.06 | −0.17 | 8.09 |
| AR(20) | 0.00 | 0.05 | −0.17 | 8.04 |
| PER | 0.00 | 0.06 | 0.13 | 9.42 |
| AR_COMB_MIN | 0.00 | 0.02 | −0.26 | 3.30 |

Figure 8:
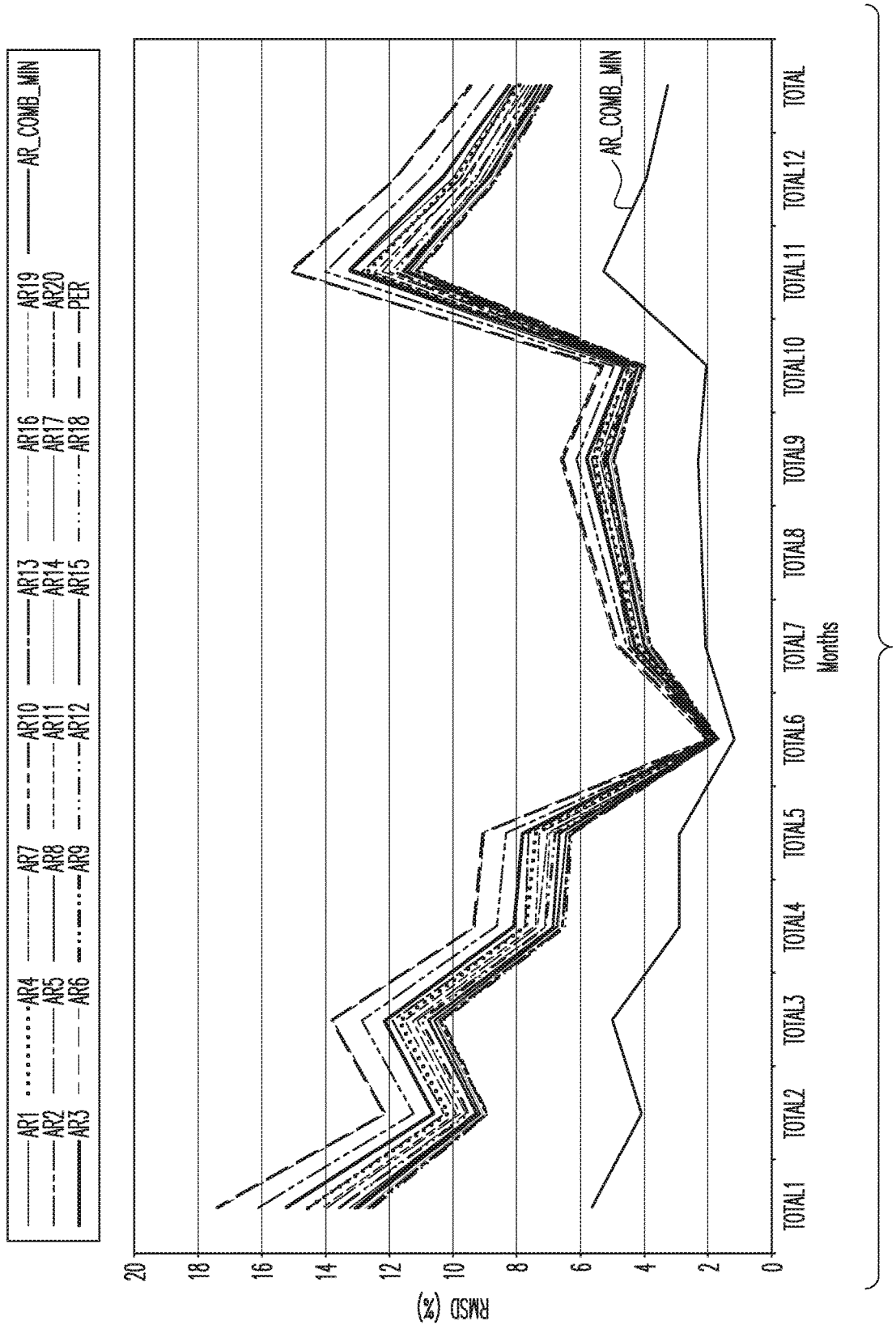
FIG. 8 is a graph comparing relative root mean squared deviation (RMSD, %) of the autoregressive (AR) models of order 1-20 against the persistence (PER) model, and a combination of the autoregressive models in an embodiment of the method of forecasting for solar-based power systems, specifically for the one-minute time series.
Figure 9:
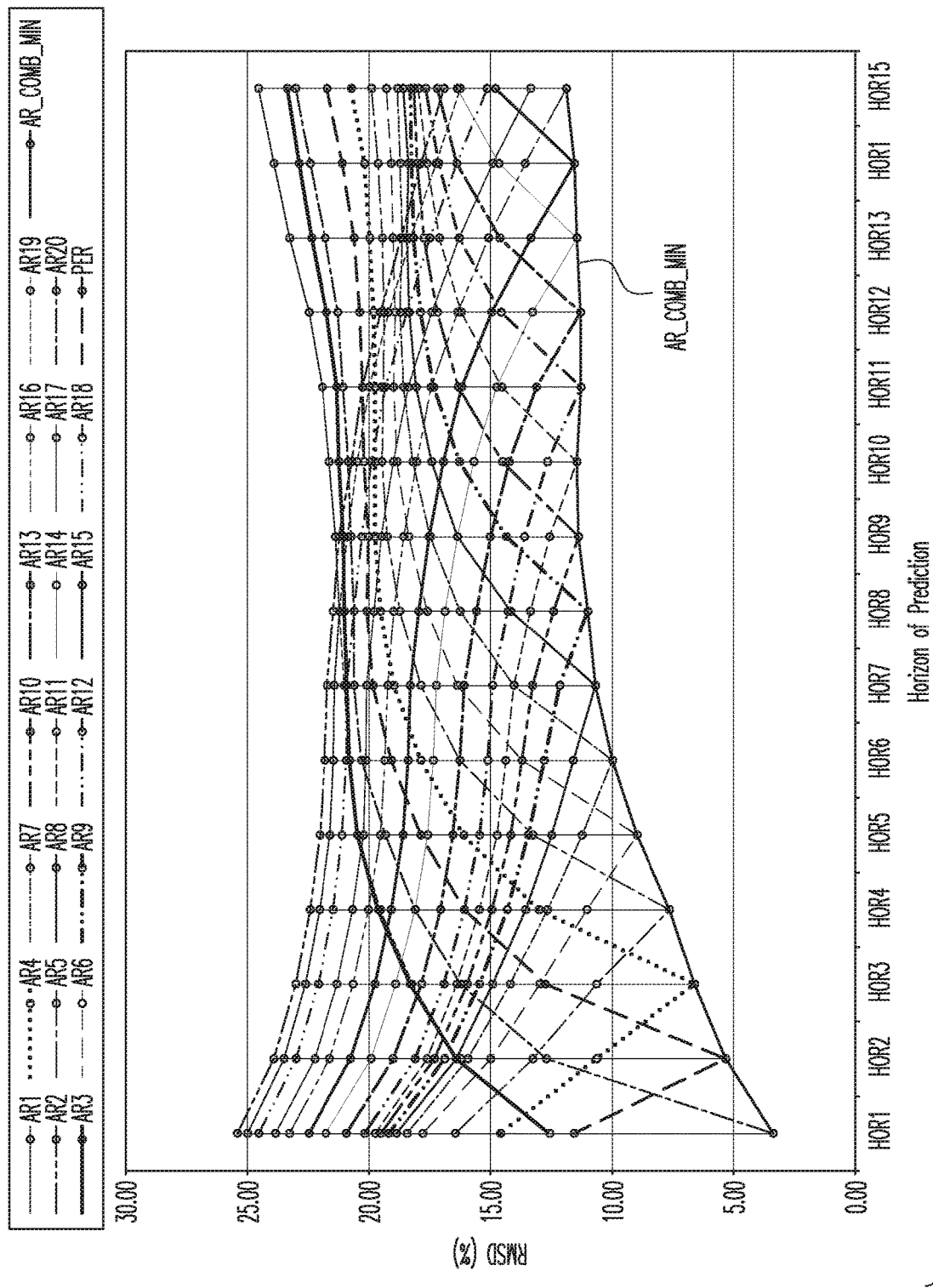
FIG. 9 is a graph comparing relative root mean squared deviation (RMSD) of the autoregressive (AR) models of order 1-20 against the persistence (PER) model, and a combination of the autoregressive models in an embodiment of the method of forecasting for solar-based power systems, specifically for each horizon of prediction applied to five-minute average time series data, with the data set being recorded in January of 2014.
Figure 10:
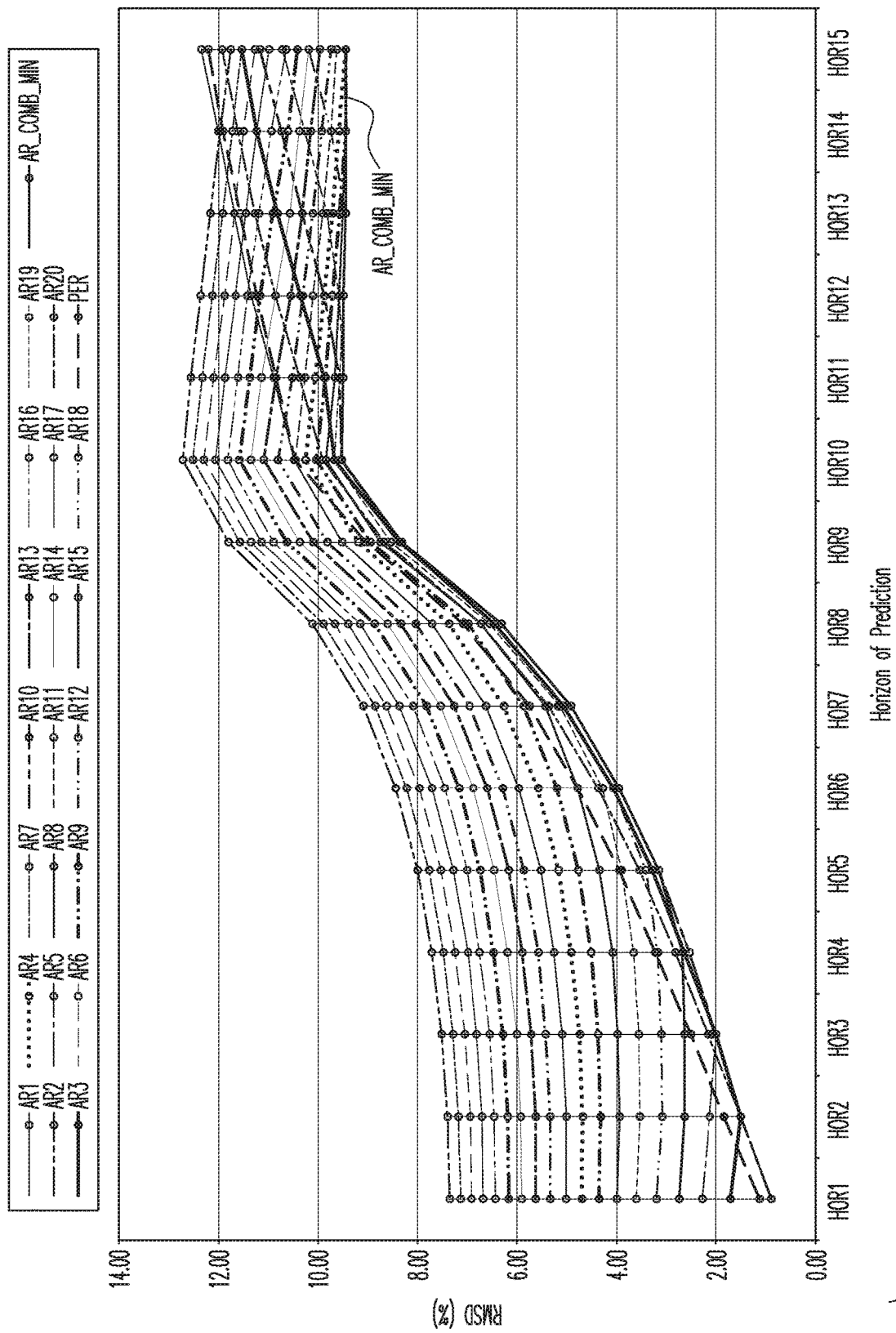
FIG. 10 is a graph comparing relative root mean squared deviation (RMSD) of the autoregressive (AR) models of order 1-20 against the persistence (PER) model, and a combination of the autoregressive models in an embodiment of the method of forecasting for solar-based power systems, specifically for each horizon of prediction applied to five-minute average time series data, with a data set recorded in June of 2014.
Figure 11:
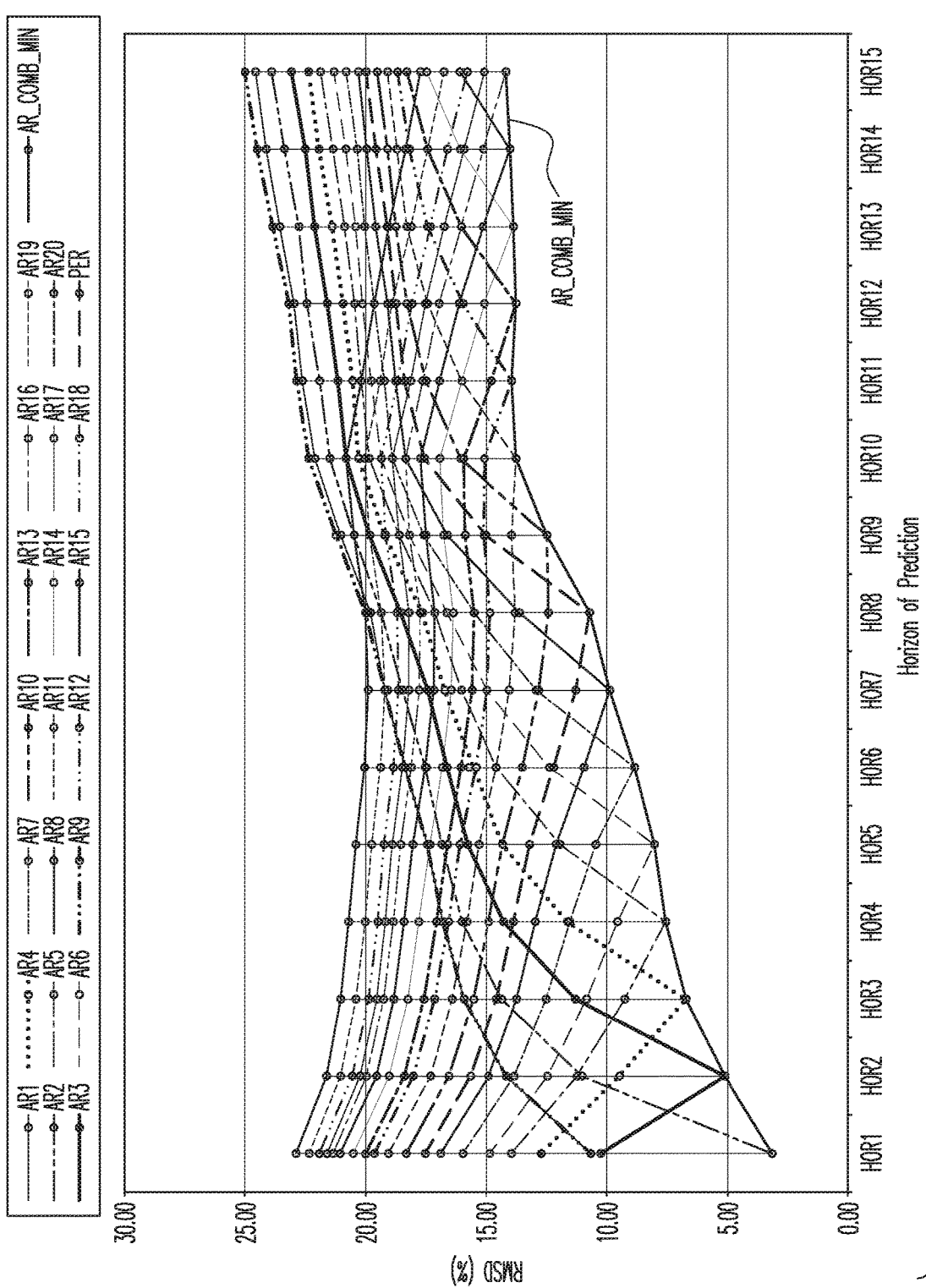
FIG. 11 is a graph comparing relative root mean squared deviation (RMSD) of the autoregressive (AR) models of order 1-20 against the persistence (PER) model, and a combination of the autoregressive models in an embodiment of the method of forecasting for solar-based power systems, specifically for each horizon of prediction applied to five-minute average time series data, with a data set recorded in November of 2014.

FIG. 8 shows model rRMSD results for the one-minute time series for each temporal horizon of prediction. The above data shows that the AR-combined model is better than any other model, including the PER baseline model. The difference is quite considerable during the entire year, except in June. The lower limit of monthly rRMSD is around 6%. FIG. 9 is a graph comparing relative root mean squared deviation (RMSD) of the autocorrelation (AR) model against the persistence (PER) model, and a combination autocorrelation model in the alternative embodiment of the method of forecasting for solar-based power systems, specifically for each horizon of prediction applied to the five-minute average time series data (taken from January of 2014). FIGS. 10 and 11 show similar comparisons for data sets recorded in June of 2014 and November of 2014, respectively.

Table 7 shows MBD, RMSD, rMBD and rRMSD results for the AR, PER and AR-combined models with the five-minute time series from 2014.

TABLE 7

MBD, RMSD, rMBD and rRMSD Results for AR, PER and
AR-combined Models with Five-minute Time Series

| Model | MBD | RMSD | rMBD(%) | rRMSD(%) |
|---|---|---|---|---|
| AR(1) | −0.01 | 0.09 | −0.96 | 13.38 |
| AR(2) | 0.00 | 0.08 | −0.56 | 12.46 |
| AR(3) | 0.00 | 0.08 | −0.14 | 11.89 |
| AR(4) | 0.00 | 0.08 | 0.05 | 11.53 |
| AR(5) | 0.00 | 0.08 | 0.19 | 11.28 |
| AR(6) | 0.00 | 0.08 | 0.26 | 11.14 |
| AR(7) | 0.00 | 0.07 | 0.32 | 11.08 |
| AR(8) | 0.00 | 0.08 | 0.34 | 11.11 |
| AR(9) | 0.00 | 0.08 | 0.36 | 11.22 |
| AR(10) | 0.00 | 0.08 | 0.37 | 11.38 |
| AR(11) | 0.00 | 0.08 | 0.38 | 11.55 |
| AR(12) | 0.00 | 0.08 | 0.38 | 11.77 |
| AR(13) | 0.00 | 0.08 | 0.38 | 12.01 |
| AR(14) | 0.00 | 0.08 | 0.38 | 12.29 |
| AR(15) | 0.00 | 0.09 | 0.39 | 12.62 |
| AR(16) | 0.00 | 0.09 | 0.41 | 13.02 |
| AR(17) | 0.00 | 0.09 | 0.40 | 13.41 |
| AR(18) | 0.00 | 0.09 | 0.39 | 13.82 |
| AR(19) | 0.00 | 0.10 | 0.38 | 14.21 |
| AR(20) | 0.00 | 0.10 | 0.39 | 14.58 |

TABLE 7-continued

MBD, RMSD, rMBD and rRMSD Results for AR, PER and
AR-combined Models with Five-minute Time Series

| Model | MBD | RMSD | rMBD(%) | rRMSD(%) |
|---|---|---|---|---|
| PER | 0.01 | 0.09 | 1.30 | 13.40 |
| AR_COMB_MIN | 0.00 | 0.05 | 0.33 | 7.72 |

Figure 12:
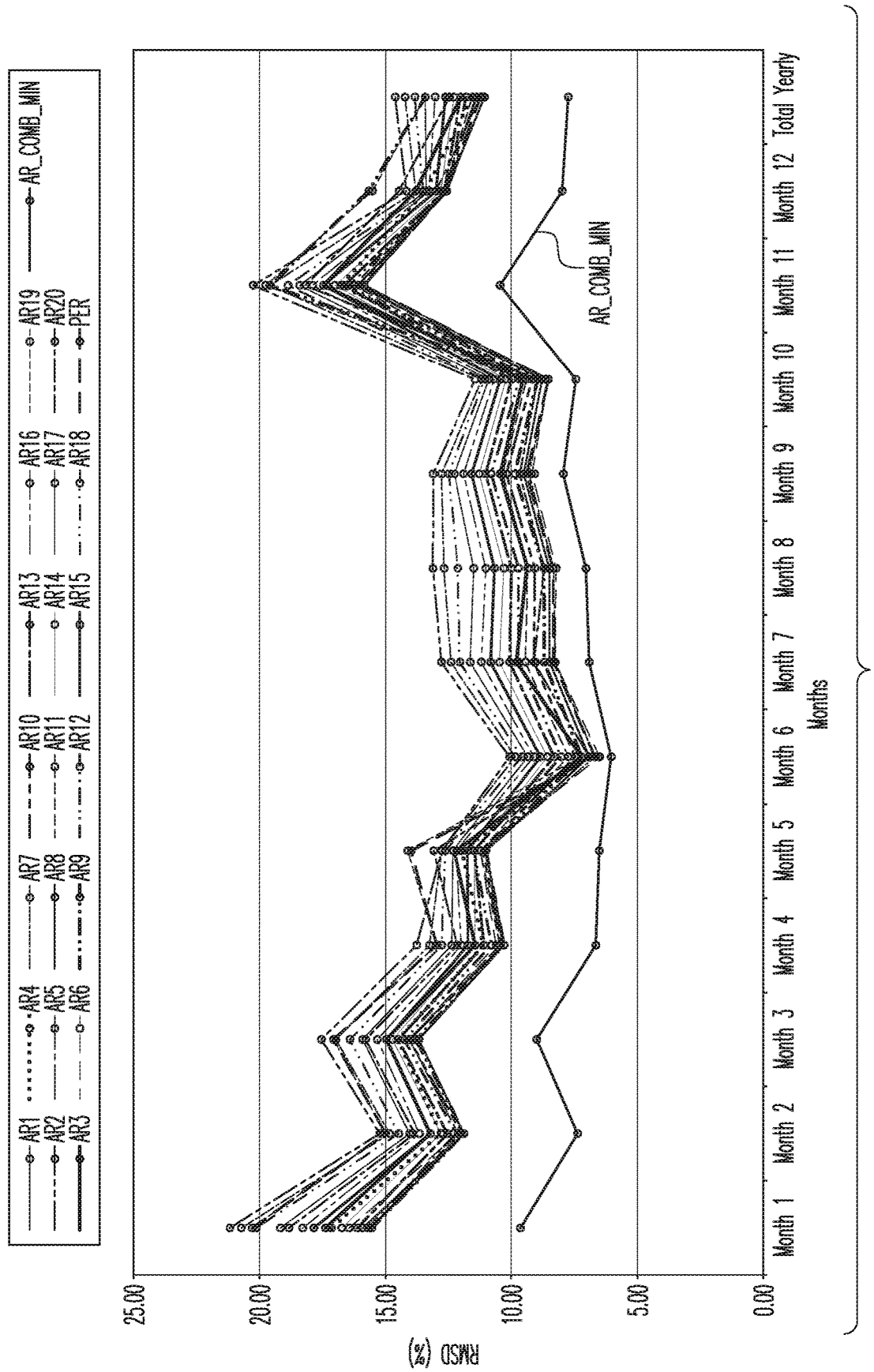
FIG. 12 is a graph comparing relative root mean squared deviation (RMSD, %) of the autoregressive (AR) models of order 1-20 against the persistence (PER) model, and a combination of the autoregressive models in an embodiment of the method of forecasting for solar-based power systems, specifically for the five-minute time series.

FIG. 12 shows model rRMSD results for the five-minute time series for each temporal horizon of prediction. From the above data, one can conclude that the AR-combined model outperforms the other models and the PER baseline model for the case of a five-minute average time series. The difference is quite considerable during the entire year, except in June. The lower limit of monthly rRMSD is around 6%.

Figure 13:
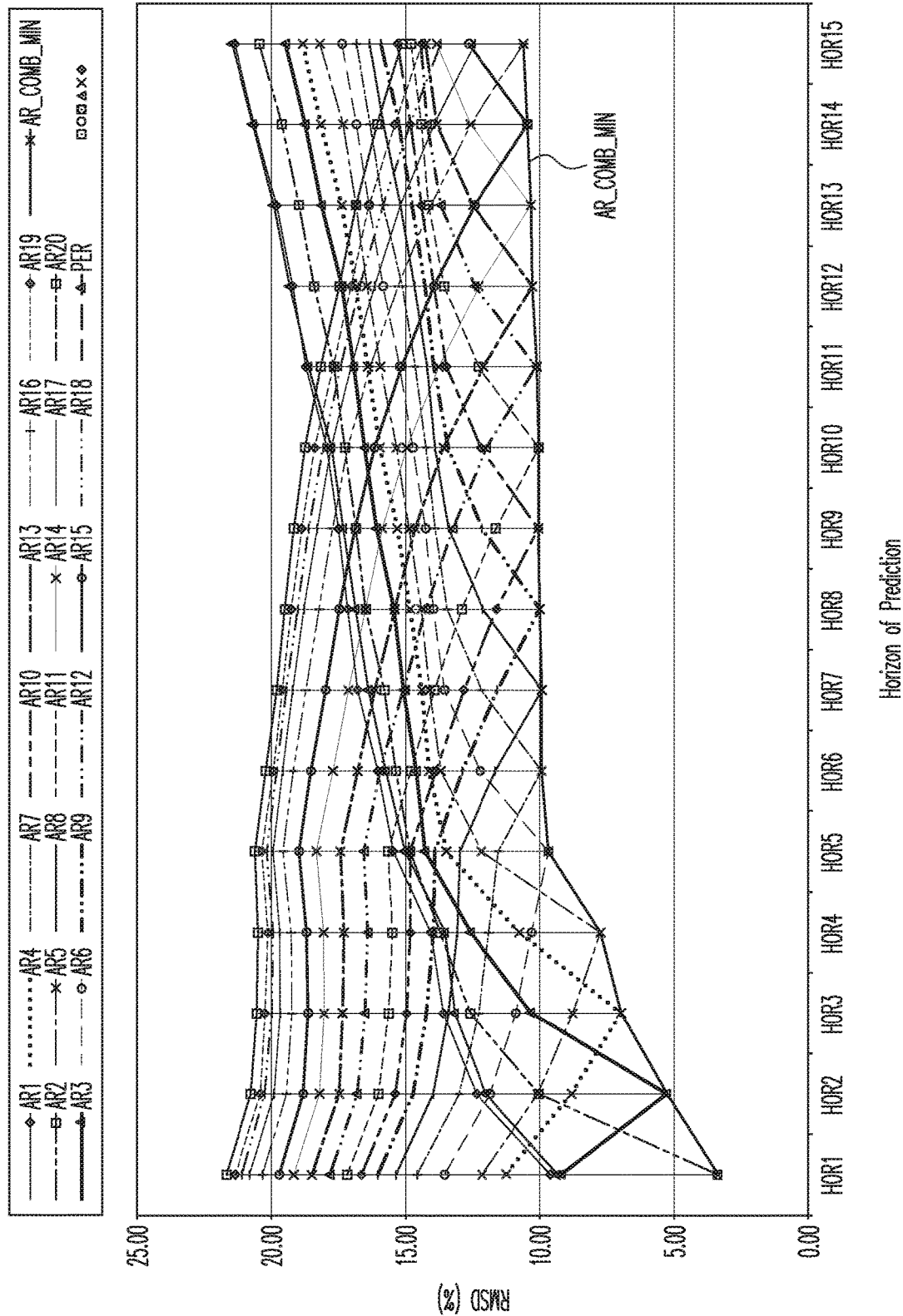
FIG. 13 is a graph comparing relative root mean squared deviation (RMSD) of the autoregressive (AR) models of order 1-20 against the persistence (PER) model, and a combination of the autoregressive models in an embodiment of the method of forecasting for solar-based power systems, specifically for each horizon of prediction applied to ten-minute average time series data, with the data set being recorded in February of 2014.
Figure 14:
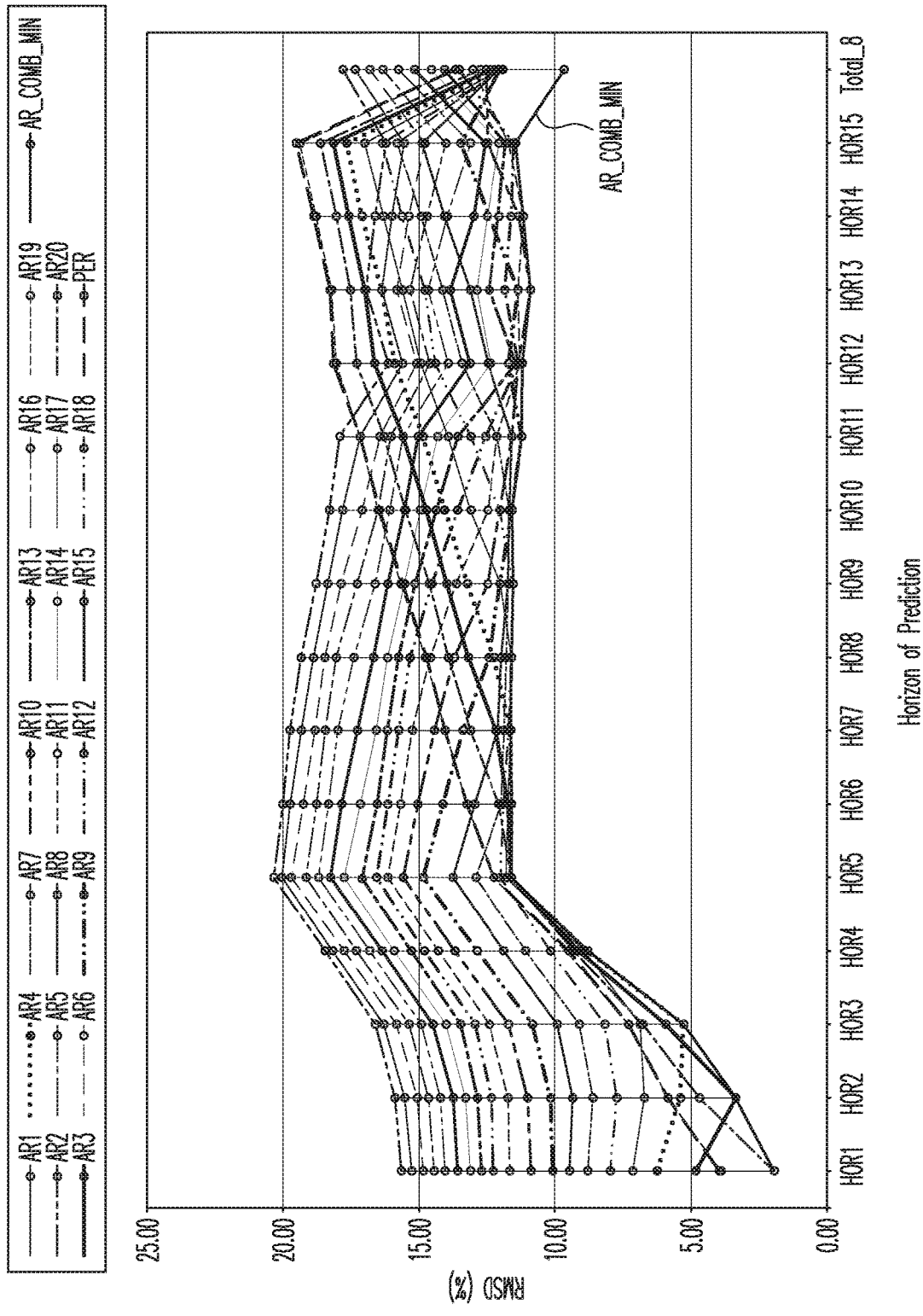
FIG. 14 is a graph comparing relative root mean squared deviation (RMSD) of the autoregressive (AR) models of order 1-20 against the persistence (PER) model, and a combination of the autoregressive models in an embodiment of the method of forecasting for solar-based power systems, specifically for each horizon of prediction applied to ten-minute average time series data, with a data set recorded in August of 2014.
Figure 15:
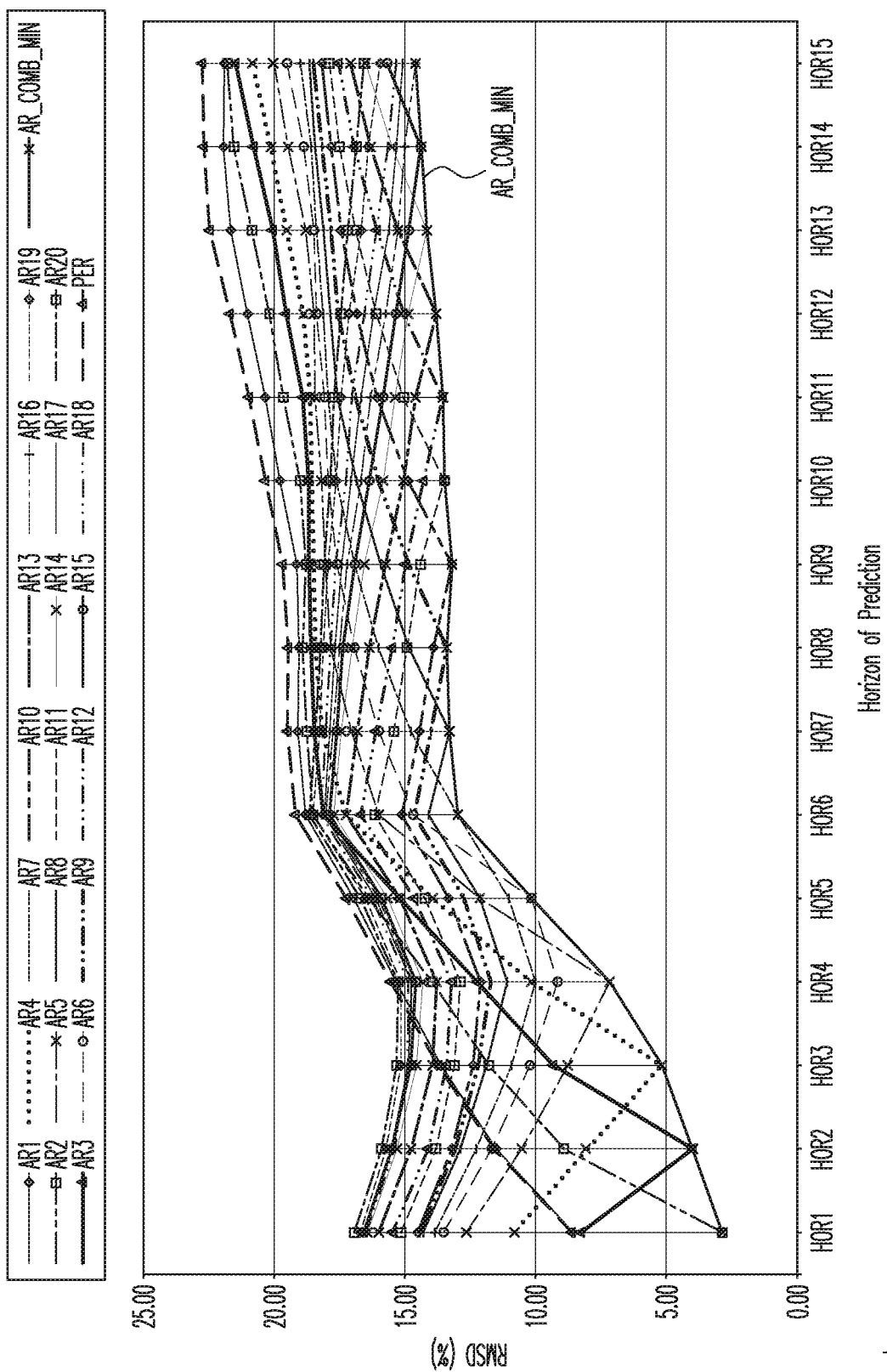
FIG. 15 is a graph comparing relative root mean squared deviation (RMSD) of the autoregressive (AR) models of order 1-20 against the persistence (PER) model, and a combination of the autoregressive models in an embodiment of the method of forecasting for solar-based power systems, specifically for each horizon of prediction applied to ten-minute average time series data, with a data set recorded in December of 2014.

FIG. 13 is a graph comparing relative root mean squared deviation (RMSD) of the autocorrelation (AR) model against the persistence (PER) model, and the combination autocorrelation model in the alternative embodiment of the method of forecasting for solar-based power systems, specifically for each horizon of prediction applied to the ten-minute average time series data (taken from February of 2014). FIGS. 14 and 15 show similar comparisons for data sets recorded in August of 2014 and December of 2014, respectively.

Table 8 shows MBD, RMSD, rMBD and rRMSD results for the AR, PER and AR-combined models with the ten-minute time series from 2014.

TABLE 8

MBD, RMSD, rMBD and rRMSD Results for AR, PER and
AR-combined Models with Ten-minute Time Series

| Model | MBD | RMSD | rMBD(%) | rRMSD(%) |
|---|---|---|---|---|
| AR(1) | 0.00 | 0.09 | −0.23 | 16.26 |
| AR(2) | 0.00 | 0.08 | 0.26 | 15.19 |
| AR(3) | 0.01 | 0.08 | 0.72 | 14.60 |
| AR(4) | 0.01 | 0.08 | 0.89 | 14.23 |
| AR(5) | 0.01 | 0.08 | 0.95 | 14.02 |
| AR(6) | 0.01 | 0.08 | 0.96 | 13.93 |
| AR(7) | 0.01 | 0.08 | 0.90 | 13.90 |
| AR(8) | 0.01 | 0.08 | 0.88 | 13.95 |
| AR(9) | 0.01 | 0.08 | 0.85 | 14.04 |
| AR(10) | 0.01 | 0.08 | 0.77 | 14.18 |
| AR(11) | 0.01 | 0.08 | 0.73 | 14.41 |
| AR(12) | 0.01 | 0.08 | 0.68 | 14.70 |
| AR(13) | 0.01 | 0.08 | 0.65 | 15.07 |
| AR(14) | 0.01 | 0.09 | 0.61 | 15.48 |
| AR(15) | 0.00 | 0.09 | 0.60 | 15.93 |
| AR(16) | 0.00 | 0.09 | 0.61 | 16.40 |
| AR(17) | 0.00 | 0.09 | 0.62 | 16.89 |
| AR(18) | 0.00 | 0.10 | 0.60 | 17.27 |
| AR(19) | 0.00 | 0.10 | 0.58 | 17.69 |
| AR(20) | 0.00 | 0.10 | 0.55 | 18.10 |
| PER | 0.02 | 0.10 | 2.62 | 16.39 |
| AR_COMB_MIN | 0.01 | 0.06 | 0.61 | 10.18 |

Figure 16:
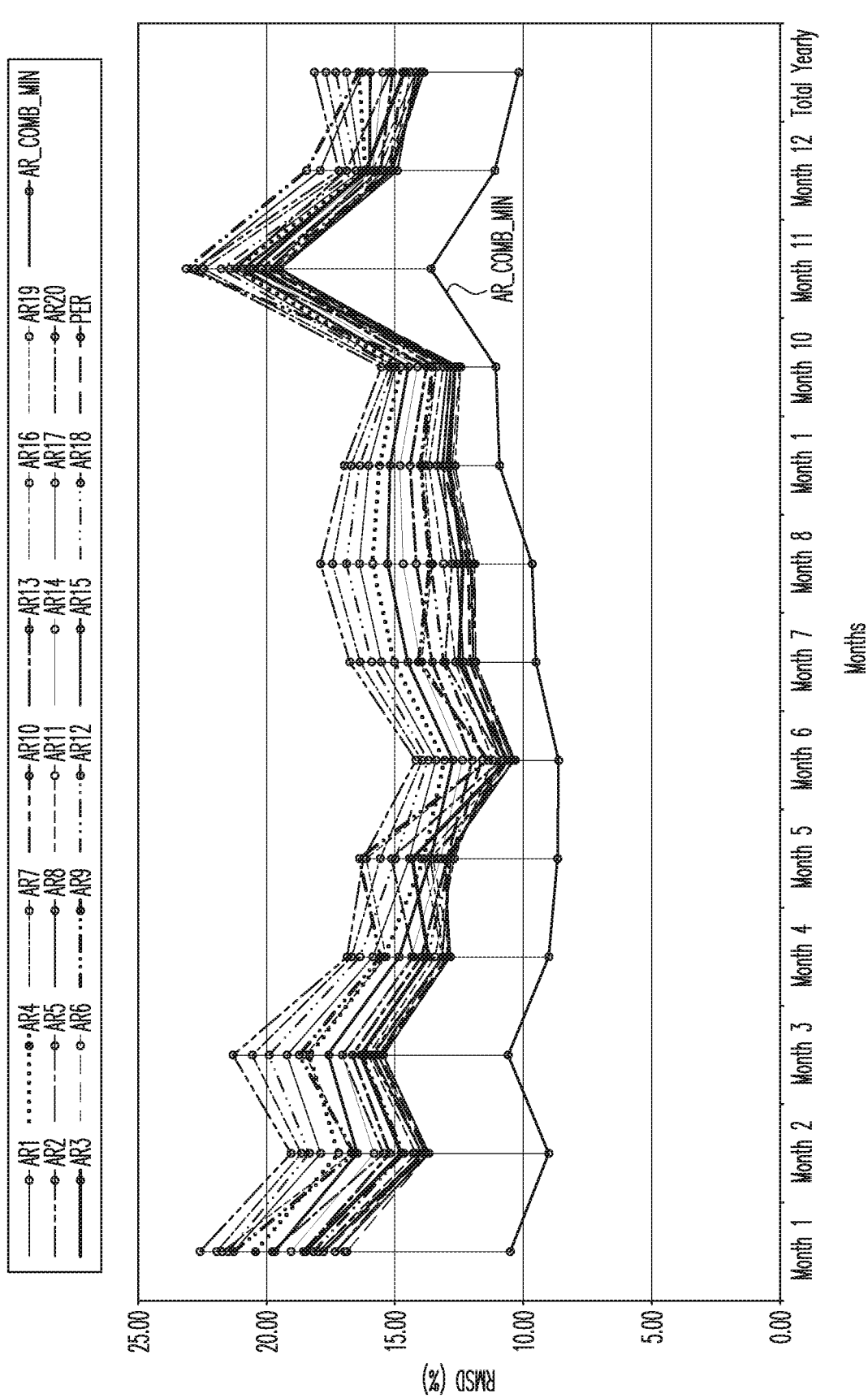
FIG. 16 is a graph comparing relative root mean squared deviation (RMSD, %) of the autoregressive (AR) models of order 1-20 against the persistence (PER) model, and a combination of the autoregressive models in an embodiment of the method of forecasting for solar-based power systems, specifically for the ten-minute time series.

FIG. 16 shows model rRMSD results for the ten-minute time series for each temporal horizon of prediction. From the above data, one can conclude that the AR-combined model is better than any AR model and the PER model, also for the case of 10 minute average time series. The difference is quite considerable during the entire year, except in June. This is due to the fact that June is a month where there are almost no clouds in Qatar and almost no impact in lower variability of solar radiation. The lower limit of monthly rRMSD is around 9%.

It is to be understood that the present invention is not limited to the embodiments described above, but encompasses any and all embodiments within the scope of the following claims.

The invention claimed is:

1. A computer-implemented method of forecasting for solar-based power systems, comprising the steps of:
   (a) providing a non-transitory computer-readable medium having embodied thereon a program, which when executed by a computer, causes the computer to execute a method of forecasting for solar-based power systems, the method comprising the steps of:
   i. measuring a first series of current solar irradiance parameters with sensors for a defined geographical region over predetermined time intervals to form a data set, wherein the measurements comprise measuring direct normal irradiance (DNI), global horizontal irradiance (GHI) and diffuse horizontal irradiance (DHI);
   ii. selecting a window size defining a number of past measurements and future forecast predictions to be made from the number of past measurements;
   iii. partitioning the data set into successive and adjacent time series training data sequences of the selected window size;
   iv. applying a plurality of different forecasting methods to the time series training data sequences to obtain future forecast predictions from each of the forecasting methods;
   v. comparing the future forecast predictions of each of the forecasting methods to measured data to obtain a corresponding error rate associated with each of the methods, given the time series training data sequences;
   vi. assigning the forecasting method with the lowest error rate as the forecasting class for the time series training data sequences;
   vii. repeating steps i through vi to train a classifier to determine an optimal forecasting class for different time series training data sequences;
   viii. using the sensors to measure a second series of current solar irradiance parameters;
   ix. using the classifier to determine the optimal forecasting class for the second series of current solar irradiance parameters;
   x. making future forecast predictions from the second series of current solar irradiance parameters using the optimal forecasting class;
   xi. predicting solar-based power system demands and generating capacities based upon the future forecast predictions made in step (j); and
   xii. making adjustments in the solar-based power system demands and stored energy in order to maintain a substantially constant voltage supply for the defined geographic region.

2. The method of forecasting for solar-based power systems as recited in claim 1, wherein the step of measuring the first and second series of current solar irradiance parameters comprises measuring in one minute intervals.

3. The method of forecasting for solar-based power systems as recited in claim 1, further comprising the step of applying data filtering to the data set generated in step i.

4. The method of forecasting for solar-based power systems as recited in claim 1, wherein the plurality of forecasting methods comprise a persistence method and a support vector regression method.

5. A computer-implemented method of forecasting for solar-based power systems, comprising the steps of:
   providing a non-transitory computer-readable medium having embodied thereon a program, which when executed by a computer, causes the computer to execute a method of forecasting for solar-based power systems, the method comprising the steps of:
   measuring solar irradiance parameters with sensors for a defined geographical region over predetermined time intervals to form a data set, wherein the measurements comprise measuring direct normal irradiance (DNI), global horizontal irradiance (GHI) and diffuse horizontal irradiance (DHI);
   selecting a window size defining a number of past measurements and future forecast predictions to be made from the number of past measurements;
   partitioning the data set into successive and adjacent time series training data sequences of the selected window size;
   applying a different autoregressive forecasting method to each of the time series training data sequences to obtain future forecast predictions;
   training a classifier to determine an optimal forecasting class for the different time series training data sequences;
   predicting solar-based power system demands and generating capacities based upon the future forecast predictions; and
   making adjustments in the solar-based power system demands and stored energy in order to maintain a substantially constant voltage supply for the defined geographic region.

6. A non-transitory computer-readable medium having embodied thereon a program, which when executed by a computer, causes the computer to execute a method of forecasting for solar-based power systems, the method comprising the steps of:
   measuring solar irradiance parameters with sensors for a defined geographical region over predetermined time intervals to form a data set;
   selecting a window size defining a number of past measurements and future forecast predictions to be made from the number of past measurements;
   partitioning the data set into successive and adjacent time series training data sequences of the selected window size;
   applying a different autoregressive forecasting method to each of the time series training data sequences to obtain future forecast predictions;
   training a classifier to determine an optimal forecasting class for the different time series training data sequences;
   predicting solar-based power system demands and generating capacities based upon the future forecast predictions; and
   making adjustments in the solar-based power system demands and stored energy in order to maintain a substantially constant voltage supply for the defined geographic region.

\* \* \* \* \*